United States Patent [19]
Sekihara et al.

[11] Patent Number: 5,218,531
[45] Date of Patent: Jun. 8, 1993

[54] NMR SPECTROSCOPIC ANALYZING METHOD

[75] Inventors: Kensuke Sekihara, Musashimurayama; Nagaaki Ohyama, Kawasaki, both of Japan

[73] Assignee: Hitachi, Ltd., Tokyo, Japan

[21] Appl. No.: 480,946

[22] Filed: Feb. 16, 1990

[30] Foreign Application Priority Data

Feb. 17, 1989 [JP] Japan ................................. 1-36127

[51] Int. Cl.⁵ ............................................ G06F 15/00
[52] U.S. Cl. ............................................... 364/413.13
[58] Field of Search ................. 364/413.13, 413.19, 364/413.16, 413.22

[56] References Cited

U.S. PATENT DOCUMENTS 4,644,473  2/1987  Kojima ........................ 364/413.13
4,982,159  1/1991  Hoshino ....................... 364/413.13

OTHER PUBLICATIONS

A. Macovski et al., "In Vivo Spectroscopic Magnetic Resonance Imaging Using Estimation Theory," Magnetic Resonance in Medicine, 1986, pp. 97-104.
R. J. Ordidge et al, "Image-Selected in Vivo Spectroscopy (ISIS). A new technique for spatially selective NMR spectroscopy", Journal of Magnetic Resonance, 1987, pp. 283-294.
H. Szu et al, "Fast Simulated Annealing", Physics Letters A, 1987, pp. 157-162.

Primary Examiner—Roy N. Envall, Jr.
Assistant Examiner—Ari M. Bai
Attorney, Agent, or Firm—Antonelli, Terry, Stout & Kraus

[57] ABSTRACT

In an NMR spectroscopic analyzing method to which the simulated annealing method is applied, each amplitude, decay constant, resonant frequency, and phase of each spectrum component of an FID signal formed by a plurality of spectrum components are used as variables. A perturbation of an estimated value of each variable and a decision of whether the perturbation is accepted or rejected are performed in sequence based on a certain probability depending on a variation amount of a cost function produced from the estimated value. The probability of accepting the perturbation is gradually decreased in the process of repeating the perturbations to obtain estimated values which minimize the cost function.

11 Claims, 4 Drawing Sheets

NMR SPECTROSCOPIC ANALYZING METHOD

BACKGROUND OF THE INVENTION

The present invention relates to a medical inspection method using magnetic resonance, and more particularly to an NMR spectroscopic analyzing method favorable for the processing of an obtained spectrum.

In a nuclear magnetic resonance inspection apparatus for medical use in the prior art, measuring an NMR spectrum is expected to provide effective information for diagnosis. In this case, however, improvement of the SN ratio (signal-to-noise ratio) is limited because natural abundance of a material as an object for inspection is small and a time allowed to be used for the measurement is limited. On the other hand, in an NMR spectroscopy for medical use, the number of spectrum components usually contained and the resonant frequencies thereof are previously known in most cases.

Consequently, utilizing such previously known data, effective information for the diagnosis may be taken even from spectrum data having a bad SN ratio. A method of processing spectrum data based on such an idea is discussed in "Magnetic Resonance in Medicine", vol. 3, pp. 97-104, (1986).

According to this method, if the number of contained spectrum components is made K, the resonant frequency of the k-th spectrum component is made $\omega_k$, the amplitude is made $A_k$, the decay constant is made $b_k$, and the phase is made $\phi_k$, the obtained free induction decay (hereinafter abbreviated as "FID") can be formulated as $$F(t) = \sum_{k=1}^{K} A_k \cdot \exp(-b_k t) \cdot \exp[i(\omega_k t + \phi_k)] \quad (1)$$

In the above-mentioned article, assuming that $b_k$, $\omega_k$ are known previously, $A_k$ which seems to include $\phi_k$ and effective information for the diagnosis is determined from the actual measured data $G(t)$ of the FID by the method of least squares.

That is, if estimate values for $\phi_k$, $A_k$ are made $\hat{\phi}_k$, $\hat{A}_k$ and the FID calculated from these values is made $F(t)$, $A_k$ and $\phi_k$ are determined so that $$\sum_t |G(t) - F(t)|^2 \rightarrow \text{minimum} \quad (2)$$

wherein $b_k$, $\omega_k$ are already known. In this method, since $b_k$, $\omega_k$ are already known, only $A_k$, $\phi_k$ remain unknown, and these can be estimated if sufficient measuring points can be obtained.

SUMMARY OF THE INVENTION

The above-mentioned method in the prior art is disadvantageous in that $\omega_k$ and $b_k$ must already known. The resonant frequency $\omega_k$ is known in most cases, but it may be affected by the local pH or may be known only in a range of values which can be taken. Further, regarding $b_k$, an accurate value can hardly be known previously, and in most cases, a rough value or a range of values can only be known. Consequently, each spectrum component of the FID cannot be estimated accurately. Particularly, when the SN ratio of the measured value of the FID signal is not sufficient, it is difficult to take out sufficiently effective information for use in the diagnosis.

Accordingly, an object of the invention is to provide a data processing method wherein each component of the FID signal including a plurality of spectrum components can be analyzed accurately.

Another object of the invention is to provide a data processing method wherein effective information can be taken out even from the FID signal having a bad SN ratio.

One feature of the invention is an NMR spectroscopic analyzing method comprising the steps of measuring the FID signal constituted by a plurality of spectrum components, performing initial setting of an estimated value of each value using a respective amplitude, decay constant, resonant frequency and phase of the plurality of spectrum components as variables, calculating a cost function indicating difference between the estimated FID calculated from the prescribed estimated value and the measured FID, calculating a variation $\Delta E$ of the cost function E when one estimated value among the above-mentioned variables is perturbed, determining whether the perturbation is accepted or rejected by the probability distribution relating to the $\Delta E$, repeating a trial of such perturbation and the decision of whether the perturbation is accepted or rejected regarding all variables in sequence, and decreasing the probability distribution gradually during the repeated process so as to find the estimated value to minimize the cost function in sequence.

The decision of whether the perturbation is accepted or rejected is performed such that if the variation $\Delta E$ of the cost function is negative, the perturbation will be accepted, and if the $\Delta E$ is positive, the perturbation will be accepted in accordance with the probability $P=\exp(-\Delta E/T)$ wherein T is a parameter called "temperature" and it is gradually decreased during the process of repeating a trial of the perturbation and the decision of acceptance or rejection.

According to such method, since estimated value of each variable is not converged to the minimum but is converged gradually to a value to minimize the cost function, information of each spectrum of the FID signal can be analyzed correctly.

Other features of the invention will be apparent from the following description of various embodiments.

DETAILED DESCRIPTION OF EMBODIMENTS

An embodiment of the invention will now be described referring to the accompanying drawings.

Figure 1:
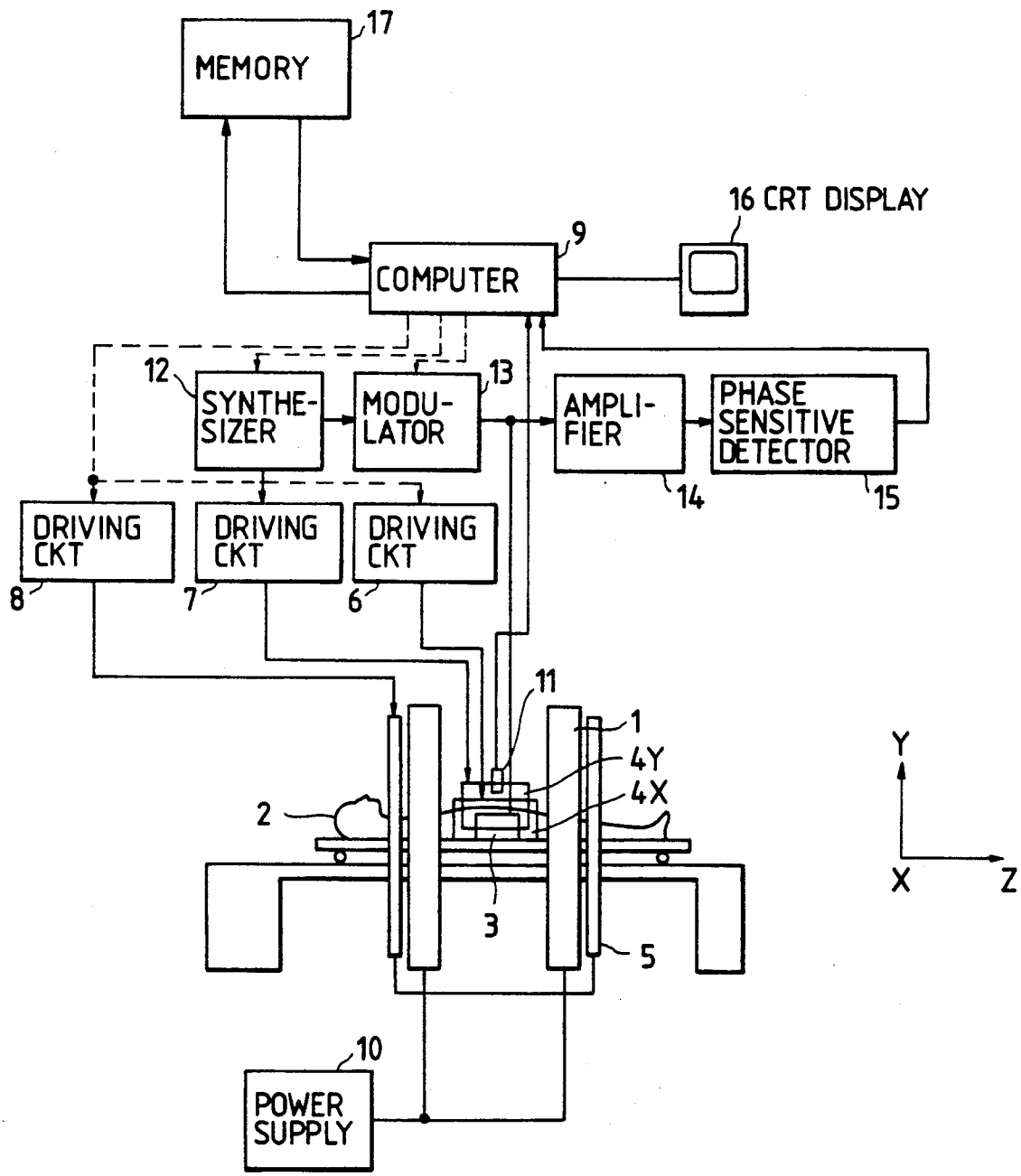
FIG. 1 is a block diagram showing an example of an apparatus to which the invention is applied.

FIG. 1 is a schematic diagram of an inspection apparatus using nuclear magnetic resonance (hereinafter abbreviated as "inspection apparatus") as an embodiment of the invention.

In FIG. 1, an electromagnet 1 is supplied with current from a power supply 10, and generates a static magnetic field of a definite direction (z-axis direction) and a definite intensity $H_0$ in its inside space. An RF coil 3 generates an RF magnetic field in the above-mentioned space, and detects an NMR signal generated from an object 2 to be inspected, which is inserted in the space. Gradient coils 4x, 4y and 5 generate gradient magnetic fields $G_x$, $G_y$, $G_z$ for adding a gradient along an X direction, a Y direction and a Z direction respectively to the intensity of the static magnetic field. A computer 9 controls driving circuits 6, 7, 8 in accordance with a programmed sequence, and generates a gradient magnetic field of a prescribed timing and a prescribed waveform. Further, an RF signal generated by a synthesizer 12 is shaped in waveform by a modulator 13 also controlled by the computer 9 and is applied to the RF coil 3, thereby an RF magnetic field of a prescribed envelope is generated at a prescribed timing. On the other hand, the NMR signal received by the RF coil 3 passes through an amplifier 14 and a phase sensitive detector 15 and is sampled in the computer 9. The sampled data is subjected to the signal processing and converted into image data and is displayed on a CRT display 16. A memory 17 is coupled with the computer 9 so as to store data during the signal processing and at the end thereof.

Figure 2:
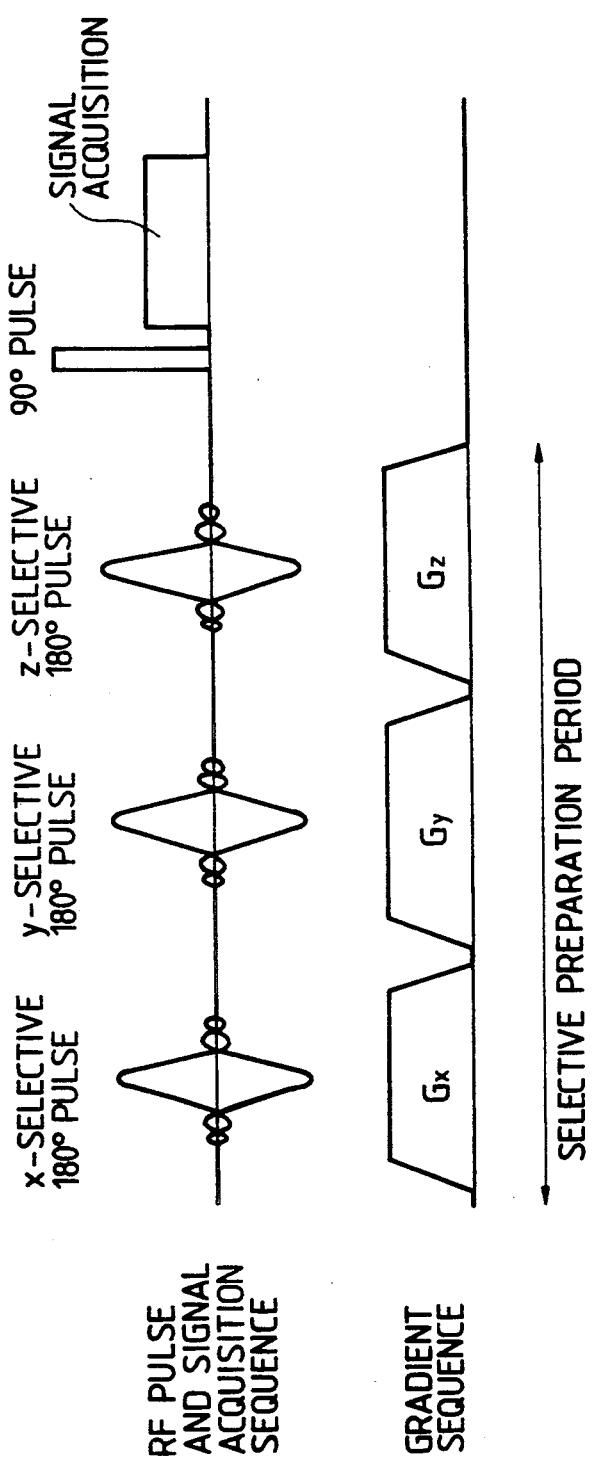
FIG. 2 is a time chart illustrating a method of measuring FID constituting part of an embodiment of the invention.

In the apparatus shown in FIG. 1, some methods are proposed to measure the NMR spectrum. A typical one is a method called ISIS and is described in "Journal of Magnetic Resonance", vol. 66, pp. 283-294, (1986). FIG. 2 shows an application sequence of the RF field and the gradient magnetic field to realize the method.

The selective preparation period is provided with periods for applying three sorts of selective pulses, i.e., an x-selective pulse being a combination of a frequency limited 180° RF pulse and the gradient magnetic field $G_x$, a y-selective pulse being a combination of a frequency limited 180° RF pulse and the gradient magnetic field $G_y$, and a z-selective pulse being a combination of a frequency limited 180° RF pulse and the gradient magnetic field $G_z$. After this period, a wide band 90° RF pulse is applied through lapse of a period of magnetic stabilization delay, and the NMR signal produced by this sampled during the signal acquisition period. This measuring sequence is repeated eight times. However, the three sorts of selective pulses are not applied every time, but as shown in Table 1, all combinations of ON, OFF of each selective pulse are executed in sequence of the experiment number 1-8. Eight sorts of the FID signals thus obtained are added in sequence of the sign of +1, −1, −1, +1, +1, −1, −1, +1 as shown in Table 1. Thereby the complex signal series determined by the frequency band of each 180° RF pulse and the magnetic field intensity distribution due to application of each gradient magnetic field and indicating the FID of spins in the specific region where three sheets of slices perpendicular to the x direction, the y direction and the z direction respectively are intersecting can be obtained.

From the complex signal series G(t) thus taken out, the spectrum information can be taken out by the simulated annealing. This method will be described as follows.

TABLE 1

| Experiment number | x-selective pulse | y-selective pulse | z-selective pulse | Contribution to total spectrum |
|---|---|---|---|---|
| 1 | OFF | OFF | OFF | +1 |
| 2 | ON | OFF | OFF | −1 |
| 3 | OFF | ON | OFF | −1 |
| 4 | ON | ON | OFF | +1 |

TABLE 1-continued

| Experiment number | x-selective pulse | y-selective pulse | z-selective pulse | Contribution to total spectrum |
|---|---|---|---|---|
| 5 | OFF | OFF | ON | −1 |
| 6 | ON | OFF | ON | +1 |
| 7 | OFF | ON | ON | +1 |
| 8 | ON | ON | ON | −1 |

Assume that the above-mentioned FIT G(t) include K sorts of spectrum components. Among these, estimated values of amplitude, decay constant, resonant frequency and phase of the k-th spectrum components are made $\hat{A}_k$, $b_k$, $\omega_k$, $\phi_k$ respectively. If the estimated FID calculated from these estimate values is written F(t), F(t) is expressed by $$F(t) = \sum_{k=1}^{K} A_k \cdot \exp(-b_k t) \cdot \exp[i(\omega_k t + \phi_k)] \quad (5)$$

If values of $\hat{A}_k$, $b_k$, $\omega_k$ and $\phi_k$ regarding any k (k=1, ..., K) are found so that the absolute value of the difference between the estimated FID F(t) and the actually measured FID G(t) or the sum total of the squares in the time direction becomes a minimum, each found value represents each spectrum component of G(t) correctly. The values of $\hat{A}_k$, $b_k$, $\omega_k$, $\phi_k$(k=1, ..., K) to give the minimum value of E in that $$E = \sum_t |G(t) - F(t)|^2 \quad (6)$$

are found as follows.

First, amplitudes $\hat{A}_k$ (k=1, ..., K) are expressed by variables $X_k$ (k=1, ..., K), decay constants $b_k$ (k=1, ..., K) are expressed by variables $X_k$ (k=K+1, ..., 2K), frequencies $\omega_k$ (k=1, ..., K) are expressed by variables $X_k$ (k=2K+1, ..., 3K), and phases $\phi_k$ (k=1, ..., K) are expressed by variables $X_k$ (k=3K+1, ..., 4K), respectively. Estimated values of these variables $X_1, ..., X_{4K}$ are determined and subjected to the initial setting to the computer 9. In the computer 9, processing of the simulated annealing is performed in accordance with the flow shown in FIG. 3. First, estimated values of the variables $X_1, ..., X_{4K}$ subjected to the initial setting by calculation formula (7) hereinafter described in detail are used, and the cost function E is calculated (step #0). Next, a sufficiently large value as the temperature T hereinafter described in detail is set, and further the perturbation width $\Delta X_k$ is set to each $X_k$ (k=1, ..., 4K) (step #1). This is set to about 1/100-1/500 of the estimated value of the variable $X_k$. This is set to a sufficiently small value if a degree of the value of $X_k$ is not at all known. Next, the initial values of the count values $N_1$, $N_2$, $N_3$ and M used in decision of whether the value of the temperature T is varied or not and decision of whether the repeated flow is finished or not are set to zero respectively (step #2 and step #3). Next, in order to assign one variable $X_k$ among the variables $X_1, ..., X_{4K}$, k is replaced by k+1. However, if k+1=4K+1, shall be k=1 (step #4). Next, a uniform random number R is generated so that the random number R becomes $0 \leq R \leq 1$, and it is determined whether the value R exceeds 0.5 or not, and the sign of the perturbation $\Delta X_k$ of the variable $X_k$ is determined at the probability 50%. In other words, if $R \geq 0.5$, $\Delta X_k$ is replaced by $-\Delta X_k$. Next in step #6, the estimated value of $X_k$ is perturbed.

In other words, $X_k$ is replaced by $X_k + \Delta X_k$. Next in steps #7 and #8, a degree of variation of the cost function E due to the perturbation of the estimated value $X_k$ performed in step #6 is calculated. First, the value of the cost function E previously estimated is made $E_o$, and E is newly calculated. Also in this case, E in formula (7) hereinafter described in detail is used (step #7). Next, calculate $\Delta E = E - E_o$ (step #8). Consequently, $\Delta E$ becomes as in following formula, and indicates variation of the cost function caused by the above-mentioned perturbation.

$$\Delta E = E(X_1, \ldots, X_k + \Delta X_k, \ldots, X_{4K}) - E(X_1, \ldots, X_k, \ldots, X_{4K})$$

Next, the sign of $\Delta E$ is determined in step #9. If $\Delta E \leq 0$, $N_1$ and M are counted up by one in step #10 and the process returns to step #4. That is, the perturbation of the value of $X_k$ in step #6 is accepted and becomes a new estimated value, and is transferred to the processing of another variable $X_{k+1}$. On the other hand, if $\Delta E > 0$ in step #9, the Boltzmann distribution $P(\Delta E) = \exp(-\Delta E/T)$ is calculated using the temperature T determined previously (step #11). Next, a uniform random number R is generated again so that $0 \leq R \leq 1$ (step #12), and the R and $P(\Delta E)$ are compared with each other (step #13). If $R \leq P(\Delta E)$, $N_2$ and M are counted up by one respectively in step #14 and the process returns to step #4. In other words, if the variation $\Delta E$ of the cost function due to the variation of the value of $X_k$ in step #6 is positive, the perturbation is accepted at a certain probability with the temperature T. On the contrary, if $R > P(\Delta E)$, $N_3$ is counted up by one (step #14), and $X_k$ is replaced by $X_k - \Delta X_k$ and E is replaced by $E_o$ (step #15). In other words, if $R > P(\Delta E)$, the pertubation of the value of $X_k$ in step #6 is rejected, and the values of $X_k$ and E are restored to those before the variation. Further in step #16, the value of M is counted up by one, and the process returns to step #4 and is transferred to the processing for the next variable $X_{k+1}$.

Figure 3:
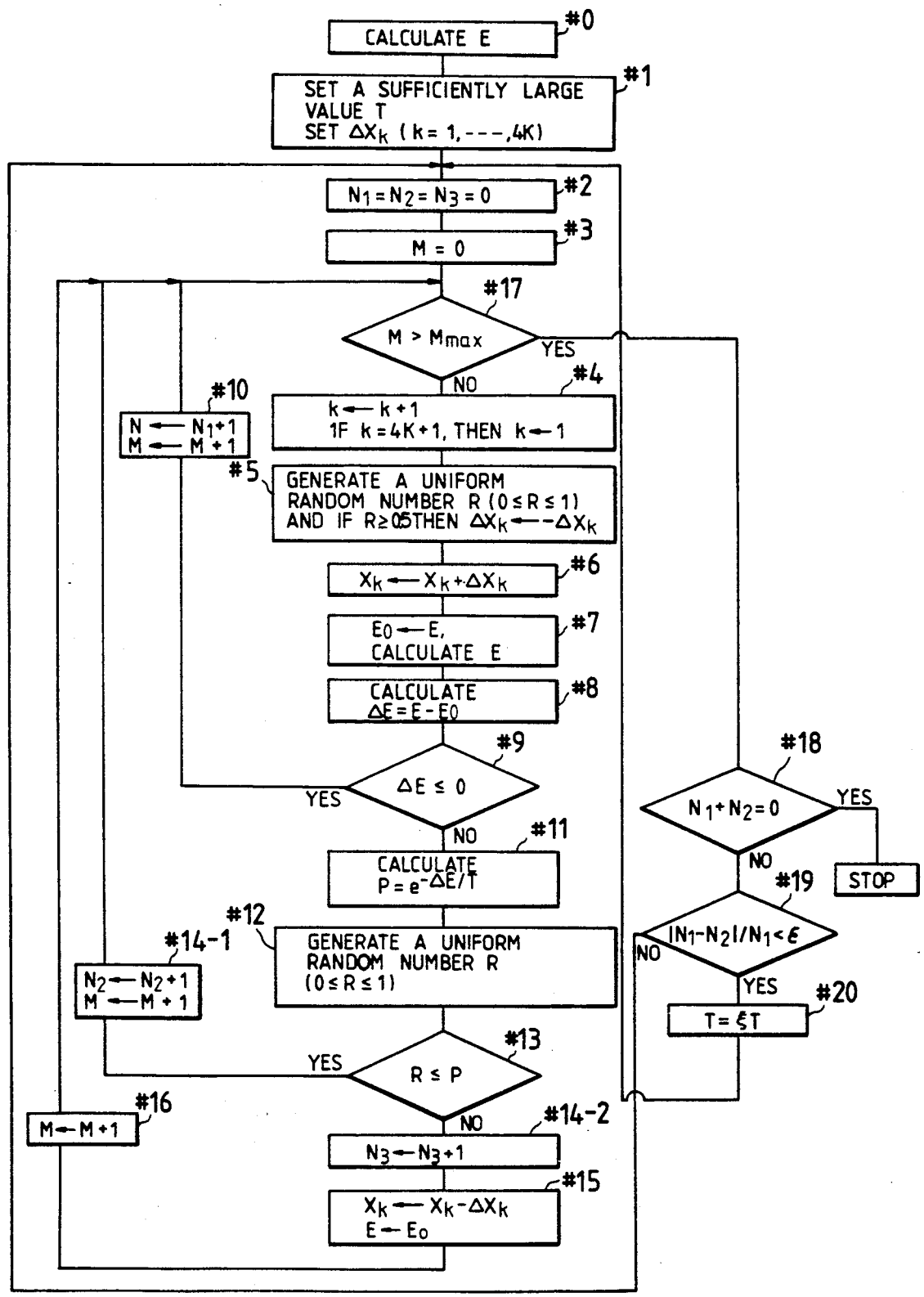
FIG. 3 is a flow chart illustrating data processing in the embodiment.

According to such three loops, the trial of the perturbation of the estimated value and the decision of whether the perturbation is accepted or rejected are performed in sequence regarding the variables $X_1, \ldots, X_{4K}$. However, when the trial of the perturbation and the decision of its acceptance or rejection are finished $M_{max}$ times in the total, this is detected in step #17 and the process transfers to steps #18–#20. In this case, $N_1$ in the flow chart of FIG. 3 is the number of those accepted in the perturbation in the direction of decreasing the cost function, $N_2$ is the number of those accepted in the perturbation in the direction of increasing the cost function, and $N_3$ is the number of the rejected perturbation. In step #19, the value of $|N_1 - N_2|/N_1$ is compared with $\epsilon$. If $|N_1 - N_2|/N_1 \geq \epsilon$, the process returns to step #2 and again the repeating of variation of the parameter and the decision of $M_{max}$ times as above described is executed. On the other hand, if $|N_1 - N_2|/N_1 < \epsilon$, this indicates that the thermal equilibrium state exists in the present temperature T, and the temperature T is decreased in step #20 and then the process returns to step #2. $\epsilon$ is set to about 0.02 for example. In this case, the temperature T is an imaginary temperature and a parameter to control the probability accepting the perturbation so that $\Delta E > 0$. The value of T is gradually decreased as the processing is repeated. As a decreasing manner, in the example of FIG. 3, T is made $T = \epsilon T$ in step #20 and value of about $\epsilon = 0.9 - 0.95$ is used. As another decreasing manner, T may be decreased in accordance with $T = T_o/(1+k)$ or $T = T_o/\log(1+k)$. Such manner of decreasing the temperature T is proposed in reference of H. SZU et al., "Fast Simulated Annealing", Physics Letters A, vol. 122, No. 3, 4, pp. 157–162, (1987).

According to the above-mentioned loops, the trial of the perturbation of the estimated values of variables and the decision of its acceptance or rejection in $M_{max}$ times as well as the decision of step #19 as a result are repeated, and as the temperature T is decreased gradually, each estimated value gradually approaches the value to minimize the cost function. That is, among the perturbations of $X_k$ in $M_{max}$ times, the perturbation to be accepted is gradually decreased. In step #18, if it is determined that the sum total $N_1 + N_2$ of the accepted perturbations regarding the perturbation of the estimated values at $M_{max}$ times becomes zero, the annealing process is finished. In other words, the variables $X_k$ ($k = 1, \ldots, 4K$) remaining then represent the amplitude $A_k$, the decay constant $b_k$, the resonant frequency $\omega_k$ and the phase $\phi_k$ of each chemical shift component of the measured FID G(t) (wherein $K = 1, \ldots, K$).

In addition, if the value of $N_3$ counted in step #13 is displayed every time the condition of $M > M_{max}$ is satisfied in step #17, the progress state of the annealing can be monitored. The decision of whether the temperature T set in step #1 is sufficiently large or not may be performed in that $\Delta E$ is calculated by the initial value suitably given in the trial and the condition $p = e^{-\Delta E/T} \geq 0.9 - 0.95$ is confirmed.

In this case, the cost function in the above-mentioned flow chart may be made the sum total in the time direction of the absolute values of error between the measured FID G(t) and the estimated FID F(t) calculated from the estimated value $X_k$ ($k = 1, \ldots, 4K$) or the sum total in the time direction of squares of the absolute values. However, in the embodiment, a range which can be taken by each variable $X_k$ ($k = 1, \ldots, 4K$) is previously set, and the estimated value of each $X_k$ is made without $X_k$ being shifted from this range during the annealing. Consequently, the calculation of the cost function in step #7 is executed in accordance with following formula.

$$E = \sum_t |G(t) - F(t)|^2 + E_L(X_1, X_2, \ldots, X_k, \ldots, X_{4K}) \quad (7)$$

wherein the second term $E_L(X_1, \ldots, X_{4K})$ of the right side of formula (7) take a very large value when each $X_k$ is shifted from the previously set range of $$X_k^\nu \leq X_k \leq X_k^\mu$$

That is $$E_L(X_1, \ldots, X_{4K}) = \infty \text{ for } X_k^\nu, \text{ or } X_k > X_k^\mu$$
$$= 0 \text{ for } X_k^\nu < X_k < X_k^\mu$$

$(k = 1, \ldots 4K)$

According to such setting of $E_L$, when $X_k$ is shifted from the above-mentioned range, $E_L$ becomes a very large value and the cost function E becomes a large value, thereby the perturbation of $X_k$ at that time is rejected. Consequently, after all, the estimated value $X_k$ remains in the range of $X_k^\nu < X_k < X_k^\nu$, and the estimated value $X_k$ to minimize the sum total of errors $$\sum_t |G(t) - F(t)|^2$$

under this restriction is estimated.

The value of $M_{max}$ may be 100–200. More specifically, the value of $M_{max}$ may be set corresponding to the number of variables to be estimated, i.e., the value of 4K in the embodiment, for example, it is set to about $M_{max}/4K=10$. Consequently, if the number K of the chemical shift components is 4, $M_{max}$ is preferably about 160.

The case of using formula (1) for the modeling of the FID has been described, and the phase $\phi_k$ is summarized in the time delay $\tau$ and the phase shift $p_o$ common to all components. Consequently, the FID F(t) may be also written as $$F(t) = \sum_{k=1}^{K} A_k \cdot \exp[-b_k(t + \tau)] \cdot \exp\{i[\omega_k(t + \tau) + P_o]\} \quad (8)$$

In this case, the quantity to be estimated is $\hat{A}_k$, $b_k$, $\omega_k$ (k=1, 2, ..., K), $\tau$, $P_o$.

Figure 4A:
FIGS. 4A-4F are time charts illustrating a method of measuring FID in another embodiment.
Figure 4B:
Figure 4C:
Figure 4D:
Figure 4E:
Figure 4F:
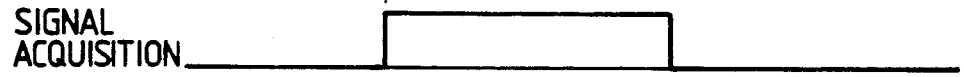

Further, this method can be applied also to NMR spectroscopic imaging. FIGS. 4A–4F show a typical sequence in this case. That is, spins in the specified slice are excited selectively by application of the frequency limited RF pulse (FIG. 4A) and the z-direction gradient magnetic field $G_z$. Next, according to the inversion of $G_z$, the phase dispersion in the rear half portion of the RF pulse due to $G_z$ is corrected, and an echo is generated at the lapse of time $t_c$ from the center time point of the RF pulse. However, during this correction period, among the gradient magnetic fields $G_x$, $G_y$ of plural amplitudes shown in FIG. 4C and FIG. 4D, the gradient magnetic field of one amplitude selected respectively is given as the phase encoding gradient magnetic field. The FID signal shown in FIG. 4E is measured after lapse of the time $t_c$ as shown in FIG. 4F. The above-mentioned measuring sequence is executed repeatedly regarding combination of the number of the prepared amplitude of $G_x$, $G_y$.

Regarding the data series of plural sets obtained in the above-mentioned manner, if the two-dimensional Fourier transformation is performed in the varying direction of amplitude of $G_x$ and the varying direction of amplitude of $G_y$, the FID regarding each coordinate position (x, y) within the above-mentioned slice can be calculated respectively. If this is made F(x, y, t), each FID with the number K of the chemical shift can be modeled as $$F(x, y, t) = \sum_{k=1}^{K} A_k(x, y) \cdot \exp[-b_k(t + t_c)] \cdot \exp\{i[\omega_k(t + t_c) + \phi_k]\} \quad (9)$$

Consequently, regarding each FID, the estimated values $\hat{A}_k(x, y)$, $b_k$, $\omega_k$ and $\Phi_k$ (k=1, ..., K) are set, and in similar manner to the embodiment described in FIG. 2 and FIG. 3, these estimated values are varied in sequence and the simulated annealing is performed. In other words, $\hat{A}_k(x, y)$, $b_k$, $\omega_k$ and $\Phi_k$ are calculated so that the error between the estimated FID F(x, y, t) shown in following formula and the FID F(x, y, t) calculated from the above-mentioned measured value is minimized.

$$F(x, y, t) = \sum_{k=1}^{K} A_k(x, y) \cdot \exp[-b_k(t + t_c)] \cdot \exp\{i[\omega_k(t + t_c) + \phi_k]\} \quad (10)$$

Since the $\hat{A}_k(x, y)$ finally determined in such manner does not include the decay within the time $t_c$, the spectrum component in each coordinate (x, y) can be shown correctly.

We claim:

1. An NMR spectroscopic analyzing method comprising the steps of:
   exciting spins of an object to be inspected and measuring FID signals formed by a plurality of spectrum components corresponding to plural sorts of chemical shift of said spins;
   defining respective amplitudes, decay constants, resonant frequencies, and phases of the plurality of spectrum components as variables and setting the variables to initial estimated values;
   calculating a cost function E based on a difference between an estimated FID calculated from the initial estimated values and a measured FID calculated from the measured FID signals; and
   determining estimated values which minimize said cost function E for the variables in sequence, including the substeps of
   i) calculating a variation $\Delta E$ of the cost function E when an estimated value of one variable among the plurality of variables is perturbed by a prescribed amount,
   ii) accepting or rejecting the perturbation of the estimated value of the one variable of substep i) based on a probability P determined from a probability distribution $P(\Delta E)$ based on $\Delta E$ calculated in substep i),
   iii) repeating substeps i) and ii) for each of the variables in sequence, and
   iv) lowering the probability distribution $P(\Delta E)$ in sequence and repeating substeps i), ii), and iii).

2. A method as set forth in claim 1, wherein the perturbation of the estimated value of the one variable in substeps i) and ii) is rejected when the estimated value after the perturbation is outside of a predetermined range.

3. A method as set forth in claim 1, wherein the perturbation of the estimated value of the one variable in substeps i) and ii) is one of a perturbation in the positive direction having a probability of ½ and a perturbation in the negative direction having a probability of ½.

4. A method as set forth in claim 1, wherein the cost function E is a sum of absolute values of differences between the estimated FID and the measured FID in a time direction or a sum of squares of the differences.

5. A method as set forth in claim 1, wherein the cost function E is a sum of (A) a sum of absolute values of differences between the estimated FID and the measured FID in a time direction or a sum of squares of the differences and (B) a function having a value of zero for an estimated value within a predetermined range and having a large value for an estimated value outside of the predetermined range.

6. A method as set forth in claim 1, wherein the probability distribution $P(\Delta E)$ in substep ii) is 1 for a negative value of $\Delta E$, and is the Boltzmann distribution $P=\exp(-\Delta E/T)$ wherein T is an imaginary temperature for a positive value of $\Delta E$.

7. A method as set forth in claim 6, wherein said imaginary temperature T is lowered in sequence.

8. A method as set forth in claim 6, wherein said temperature T is lowered when substep iii) has been repeated a prescribed number of times $M_{max}$ and a difference between a number of times a perturbation was accepted in substep ii) for a negative value of $\Delta E$ and a number of times a perturbation was accepted in substep ii) for a positive value of $\Delta E$ is a prescribed number of times or less.

9. A method as set forth in claim 1, wherein substep iv) is executed until a number of times a perturbation was accepted in substep ii) is zero after substep iii) has been repeated a prescribed number of times $M_{max}$.

10. An NMR spectroscopic analyzing method comprising the steps of:
exciting spins of an object to be inspected and measuring FID signals formed by a plurality of spectrum components corresponding to plural sorts of chemical shift of said spins;
defining respective amplitudes, decay constants, resonant frequencies, and phases of the plurality of spectrum components as variables and setting the variables to initial estimated values;
calculating a cost function E based on a difference between an estimated FID calculated from the initial estimated values and a measured FID calculated from the measured FID signals; and
determining estimated values which minimize said cost function E for the variables in sequence, including the substeps of
i) calculating a variation $\Delta E$ of the cost function E when an estimated value of one variable among the plurality of variables is perturbed by a prescribed amount,
ii) rejecting the perturbation of the one variable of substep i) when the estimated value after the perturbation is outside of a predetermined range, and accepting the perturbation based on a probability of 1 for a negative value of $\Delta E$ and based on a certain probability P determined from a probability distribution $P(\Delta E)$ based on $\Delta E$ calculated in substep i) for a positive value of $\Delta E$ when the estimated value after the perturbation is within the predetermined range,
iii) repeating substeps i) and ii) for each of the variables in sequence, and
iv) lowering the probability distribution $P(\Delta E)$ in sequence and repeating substeps i), ii), and iii).

11. An NMR spectroscopic analyzing method comprising the steps of:
exciting spins of an object to be inspected and measuring FID signals formed by a plurality of spectrum components corresponding to plural sorts of chemical shift of said spins;
defining respective amplitudes, decay constants, and resonant frequencies of the plurality of spectrum components and a time delay and a phase shift common to all of the spectrum components as variables and setting the variables to initial estimated values;
calculating a cost function E based on a difference between an estimated FID calculated from the initial estimated values and a measured FID calculated from the measured FID signals; and
determining estimated values which minimize said cost function E for the variables in sequence, including the substeps of
i) calculating a variation $\Delta E$ of the cost function E when an estimated value of one variable among the plurality of variables is perturbed by a prescribed amount,
ii) accepting or rejecting the perturbation of the estimated value of the one variable of substep i) based on a probability P determined from a probability distribution $P(\Delta E)$ based on $\Delta E$ calculated in substep i),
iii) repeating substeps i) and ii) for each of the variables in sequence, and
iv) lowering the probability distribution $P(\Delta E)$ in sequence and repeating substeps i), ii), and iii).

* * * * *